United States Patent
Chiang et al.

(10) Patent No.: US 9,911,606 B2
(45) Date of Patent: Mar. 6, 2018

(54) MANDREL SPACER PATTERNING IN MULTI-PITCH INTEGRATED CIRCUIT MANUFACTURING

(71) Applicant: Taiwan Semiconductor Manufacturing Co., Ltd., Hsin-Chu (TW)

(72) Inventors: Chia-Ping Chiang, Taipei (TW); Ya-Ting Chang, Nantou County (TW); Wen-Li Cheng, Taipei (TW); Nian-Fuh Cheng, Hsinchu (TW); Ming-Hui Chih, Taipei County (TW); Wen-Chun Huang, Tainan (TW); Ru-Gun Liu, Hsinchu County (TW); Tsai-Sheng Gau, HsinChu (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 0 days.

(21) Appl. No.: 15/267,341

(22) Filed: Sep. 16, 2016

(65) Prior Publication Data

US 2017/0316938 A1 Nov. 2, 2017

Related U.S. Application Data

(60) Provisional application No. 62/328,861, filed on Apr. 28, 2016.

(51) Int. Cl.
| | |
|---|---|
| *H01L 21/311* | (2006.01) |
| *H01L 21/033* | (2006.01) |
| *G03F 7/20* | (2006.01) |
| *H01L 21/768* | (2006.01) |
| *H01L 31/18* | (2006.01) |

(52) U.S. Cl.
CPC ...... *H01L 21/0337* (2013.01); *G03F 7/70283* (2013.01); *H01L 21/0338* (2013.01); *H01L 21/31144* (2013.01); *H01L 21/76831* (2013.01); *H01L 21/76843* (2013.01); *H01L 31/1892* (2013.01)

(58) Field of Classification Search
CPC ............. H01L 21/0337; H01L 21/0338; H01L 21/76831; H01L 21/76843; H01L 21/31144; H01L 31/1892; G03F 7/70283
USPC ...................... 438/694, 696, 736; 216/39, 54
See application file for complete search history.

(56) References Cited

U.S. PATENT DOCUMENTS

| | | | |
|---|---|---|---|
| 8,039,179 B2 | 10/2011 | Shieh et al. | |
| 8,202,681 B2 | 6/2012 | Lin et al. | |
| 8,728,332 B2 | 5/2014 | Lin et al. | |

(Continued)

*Primary Examiner* — Binh X Tran
(74) *Attorney, Agent, or Firm* — Haynes and Boone, LLP

(57) ABSTRACT

A method of manufacturing an integrated circuit (IC) includes receiving a design layout of the IC, wherein the design layout includes two abutting blocks, the two blocks include target patterns, and the target patterns have different pitches in the two blocks. The method further includes generating mandrel pattern candidates in spaces between adjacent target patterns, and assigning first and second colors to the mandrel pattern candidates according to their priorities. The method further includes removing the mandrel pattern candidates assigned with the second color, and outputting a mandrel pattern in computer-readable format for mask fabrication. The mandrel pattern includes the mandrel pattern candidates that are colored with the first color.

20 Claims, 13 Drawing Sheets

(56) References Cited

U.S. PATENT DOCUMENTS

| | | | |
|---|---|---|---|
| 8,822,243 B2 | 9/2014 | Yan et al. | |
| 2006/0091468 A1 | 5/2006 | Liaw | |
| 2011/0281208 A1 | 11/2011 | Lin et al. | |
| 2012/0278776 A1 | 11/2012 | Lei et al. | |
| 2013/0295769 A1 | 11/2013 | Lin et al. | |
| 2013/0320451 A1 | 12/2013 | Liu et al. | |
| 2014/0110817 A1* | 4/2014 | Bergendahl | H01L 21/3086 257/506 |
| 2014/0193974 A1* | 7/2014 | Lee | H01L 21/76816 438/669 |
| 2014/0215421 A1 | 7/2014 | Chen et al. | |
| 2014/0225270 A1* | 8/2014 | Yuan | H01L 21/308 257/773 |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2014/0282296 A1* | 9/2014 | Zou | H01L 29/66795 716/53 |
| 2015/0040077 A1* | 2/2015 | Ho | G03F 7/70433 716/51 |
| 2015/0052490 A1* | 2/2015 | Cilingir | G03F 1/36 716/52 |
| 2015/0056724 A1* | 2/2015 | Shieh | H01L 22/12 438/14 |
| 2015/0095857 A1* | 4/2015 | Hsu | G06F 17/5081 716/52 |
| 2015/0348959 A1* | 12/2015 | Clark, Jr. | H01L 27/1211 257/350 |
| 2016/0049307 A1* | 2/2016 | Chen | H01L 21/0337 438/696 |

* cited by examiner

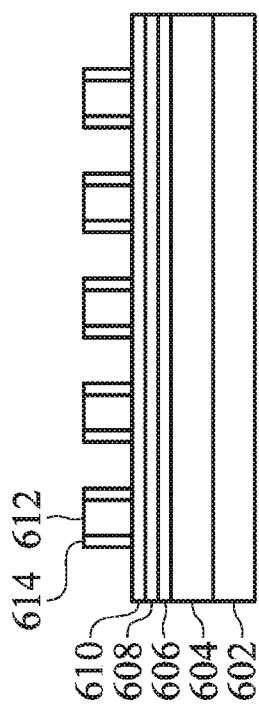
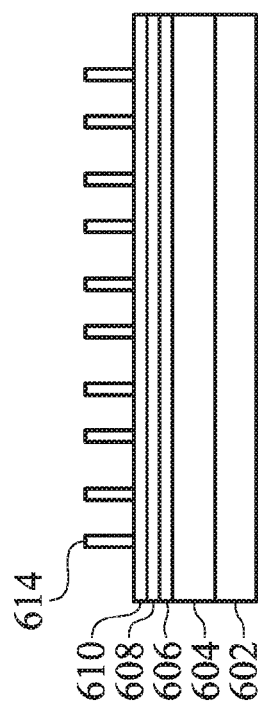
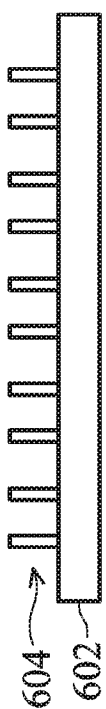
FIG. 6C
FIG. 6D
FIG. 6E

MANDREL SPACER PATTERNING IN MULTI-PITCH INTEGRATED CIRCUIT MANUFACTURING

PRIORITY

This claims the benefit of U.S. Prov. App. Ser. No. 62/328,861, entitled "Mandrel Spacer Patterning in Multi-Pitch Integrated Circuit Manufacturing," filed Apr. 28, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. This scaling down process generally provides benefits by increasing production efficiency and lowering associated costs, but it has also increased the complexity of processing and manufacturing ICs.

For example, a spacer technique is generally used for doubling the exposed patterns when fabricating fin field effect transistor (FinFET) devices. That is, the pitch of a final pattern is reduced to only half compared with the first exposed pattern. A typical spacer technique uses two masks. The first one defines a mandrel pattern in a first exposure and the second one defines a cut pattern in a second exposure. The cut pattern removes unwanted portions of the mandrel pattern, a derivative, or both. Subsequently, spacer patterns are formed on sidewalls of the remaining mandrel patterns. The pitch of the spacer patterns is reduced to only half compared with the pitch of the mandrel patterns. The spacer patterns are used for patterning layers in or on a semiconductor substrate, for example, in the process of forming gate electrodes for FinFETs.

As device integration increases, it is frequently desirable to pack multiple blocks or macros into one IC chip and further place them abutted in layout in order to save wafer area. These blocks or macros have their own pattern pitches, which may vary from block to block. These abutting blocks or macros may include logic blocks, SRAM (Static Random Access Memory) blocks, and other macros. The patterns in these abutting blocks may be formed using the spacer technique discussed above. However, it remains challenging how to effectively and efficiently design the mandrel patterns for these abutting blocks as the mandrel patterns need to accommodate different pattern pitches when crossing block boundaries.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6A, 6B, 6C, 6D, and 6E illustrate top and cross-sectional view of forming a target pattern in or on a substrate using a mandrel and spacer technique.

DETAILED DESCRIPTION

Figure 1A:
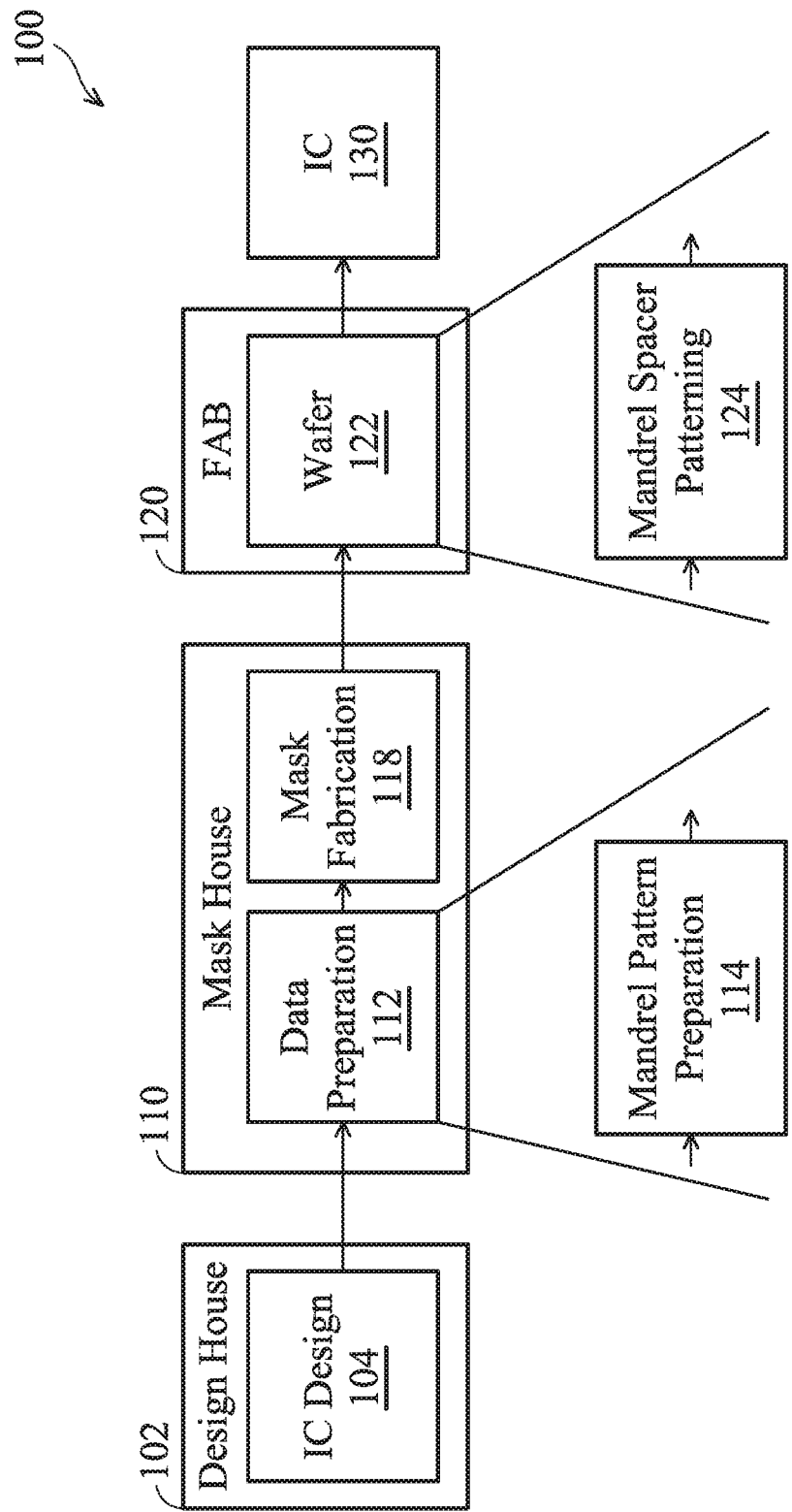
FIG. 1A is a simplified block diagram of an embodiment of an integrated circuit (IC) manufacturing system and an associated IC manufacturing flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for manufacturing integrated circuits (IC), and more particularly related to applying mandrel and spacer technique for an IC layout that has abutting blocks with varying pattern pitches.

FIG. 1A is a simplified block diagram of an embodiment of an integrated circuit (IC) manufacturing system 100 and an IC manufacturing flow associated therewith, which may benefit from various aspects of the present disclosure. The IC manufacturing system 100 includes a plurality of entities, such as a design house 102, a mask house 110, and an IC manufacturer 120 (i.e., a fab), that interact with one another in the design, development, and manufacturing cycles and/or services related to manufacturing an integrated circuit (IC) device 130. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 102, mask house 110, and IC manufacturer 120 may be owned by a single larger company, and may even coexist in a common facility and use common resources.

The design house (or design team) 102 generates an IC design layout (or IC layout) 104. The IC layout 104 includes various geometrical patterns designed for the IC 130. The geometrical patterns correspond to patterns of metal, oxide, or semiconductor layers that make up the various components of the IC 130 to be fabricated. The various layers combine to form various IC features. For example, a portion of the IC layout 104 includes various IC features, such as an active regions, gate electrodes, sources and drains, metal lines or vias of an interlayer interconnection, and openings for bonding pads, to be formed in a semiconductor substrate (such as a silicon wafer) and various material layers disposed on the semiconductor substrate. The design house 102 implements a proper design procedure to form the IC layout 104. The design procedure may include logic design, physical design, and/or place and route.

In today's advanced manufacturing processes, the IC layout 104 generally needs to comply with a set of manufacturing rules in order to be fabricated properly downstream. Merely as an example for FinFET processes, fin active regions are designed to be rectangular features and are oriented lengthwise in one direction, and gate electrodes are designed to be rectangular features and are oriented lengthwise perpendicular to the fin active regions. It is frequently noted that an IC design layout has parallel rectangular pieces spaced with a certain pitch and each having certain length and width.

At the same time, it is frequently desirable to pack various design blocks into the IC layout 104 in order to increase device integration. The various design blocks may have different performance targets, and are therefore designed to have different circuit features. For example, two design blocks may have different gate lengths and have different gate pitches. For another example, a logic block may be placed abutting an SRAM block to save area. The logic block is designed for circuit performance (e.g., switching speed, driving current, etc.), while the SRAM block is designed for circuit density. As a result, the gate pitch in the logic block is different from that of the SRAM block. Embodiments of the present disclosure are directed to effectively and efficiently manufacturing an IC with multiple abutting blocks whose pattern pitches vary from one to another. This aspect will be further discussed in later sections.

The IC layout 104 is presented in one or more data files having information of the geometrical patterns. For example, the IC layout 104 can be expressed in a GDSII file format or DFII file format.

The mask house 110 uses the IC layout 104 to manufacture one or more masks to be used for fabricating the various layers of the IC device 130. The mask house 110 performs mask data preparation 112, where the IC layout 104 is translated into a form that can be physically written by a mask writer, and mask fabrication 118, where the data prepared by the mask data preparation 112 is modified to comply with a particular mask writer and/or mask manufacturer and is then fabricated. In the present embodiment, mask data preparation 112 and mask fabrication 118 are illustrated as separate elements. However, mask data preparation 112 and mask fabrication 118 can be collectively referred to as mask data preparation.

In the present embodiment, the mask data preparation 112 includes a module called mandrel pattern preparation 114. The mask data preparation 112 may include additional modules, such as optical proximity correction (OPC), mask rule checker, lithography process checker, and other resolution enhancement techniques (RET), which are not shown here. As lithography exposure using deep ultraviolet light (such as 193 nm) approaches its resolution limits, various techniques are devised for extending the usable life of the existing lithography tools. One of the techniques is mandrel spacer patterning. In this technique, a mandrel pattern is formed using a first exposure, and a spacer pattern is formed on sidewalls of the mandrel pattern. Then, the mandrel pattern is removed and the spacer pattern is used for further patterning steps in order to form a final pattern. The pitch of the spacer pattern is reduced to only half of that of the mandrel pattern, thereby increasing the resolution of the patterning process. In this technique, the mandrel pattern is prepared according to the target final pattern defined in the IC layout 104. When the IC layout 104 has abutting blocks with varying pitches as discussed above, designing the mandrel patterns to accommodate different pitches, especially across block boundaries, can be challenging and time-consuming. In the present embodiment, the mandrel pattern preparation 114 is designed to effectively address this design need, as will be explained in conjunction with FIG. 1C.

After mask data preparation 112 modifies the IC layout 104, a mask or a group of masks are fabricated based on the modified IC layout during mask fabrication 118. For example, an electron-beam (e-beam) or a mechanism of multiple e-beams is used to form a pattern on a mask (photomask or reticle) based on the modified IC layout. The mask can be formed in various technologies. For example, the mask may be formed using binary technology to include opaque regions and transparent regions. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In a phase shift mask (PSM), various features in the pattern formed on the mask are configured to have proper phase difference to enhance the resolution and imaging quality. In various examples, the PSM can be attenuated PSM or alternating PSM as known in the art. In the present embodiment, mandrel patterns prepared by the module 114 (the mandrel patterns may have gone through OPC or other RET processes as well) are formed on a mask.

The IC manufacturer 120, such as a semiconductor foundry, uses the mask (or masks) fabricated by the mask house 110 to fabricate the IC device 130. The IC manufacturer 120 is an IC fabrication business that can include a myriad of manufacturing facilities for the fabrication of a variety of different IC products. For example, there may be a first manufacturing facility for the front end fabrication of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a semiconductor wafer is fabricated using the mask (or masks) to form the IC device 130. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask having the mandrel patterns may be used in a process of mandrel spacer patterning 124 to form fin active regions, gate electrodes, and/or other IC features. The process of mandrel spacer patterning 124 will be further discussed in later sections.

Figure 1B:
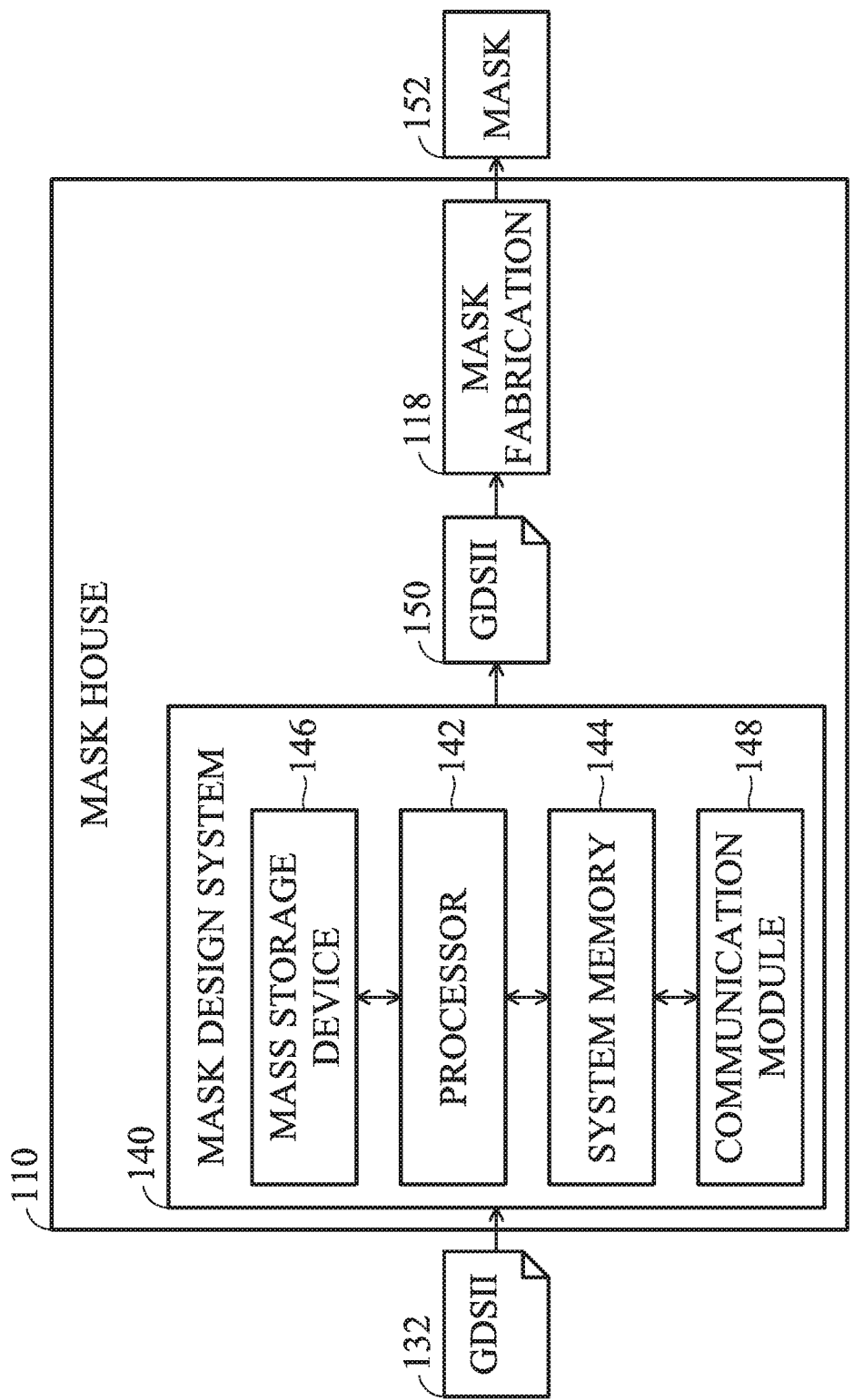
FIG. 1B is a more detailed block diagram of the mask house shown in FIG. 1 according to various aspects of the present disclosure.

FIG. 1B is a more detailed block diagram of the mask house 110 shown in FIG. 1A according to various aspects of the present disclosure. In the illustrated embodiment, the mask house 110 includes a mask design system 140 that is operable to perform the functionality described in association with mask data preparation 112 of FIG. 1A. The mask design system 140 is an information handling system such as a computer, server, workstation, or other suitable device. The system 140 includes a processor 142 that is communicatively coupled to a system memory 144, a mass storage device 146, and a communication module 148. The system memory 144 provides the processor 142 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 146. Examples of mass storage devices may include hard discs, optical disks, magneto-optical discs, solid-state storage devices, and/or a variety other mass storage devices known in the art. The communication module 148 is operable to communicate information such as IC design layout files with the other components in the IC manufacturing system 100, such as design house 102. Examples of communication modules may include Ethernet cards, 802.11 WiFi devices, cellular data radios, and/or other suitable devices known in the art.

In operation, the mask design system 140 is configured to manipulate the IC layout 104, including generating mandrel patterns for various abutting blocks whose pattern pitches vary from one block to another. For example, in an embodiment, mandrel pattern preparation 114 may be implemented as software instructions executing on the mask design system 140. In such an embodiment, the mask design system 140 receives a first GDSII file 132 containing the IC layout 104 from the design house 102. After the mask data preparation 112 is complete, the mask design system 140 transmits a second GDSII file 150 containing a design layout having mandrel patterns to mask fabrication 118. In alternative embodiments, the IC layout 104 may be transmitted between the components in IC manufacturing system 100 in alternate file formats such as DFII, CIF, OASIS, or any other suitable file type. Further, the mask design system 140 and the mask house 110 may include additional and/or different components in alternative embodiments.

Figure 1C:
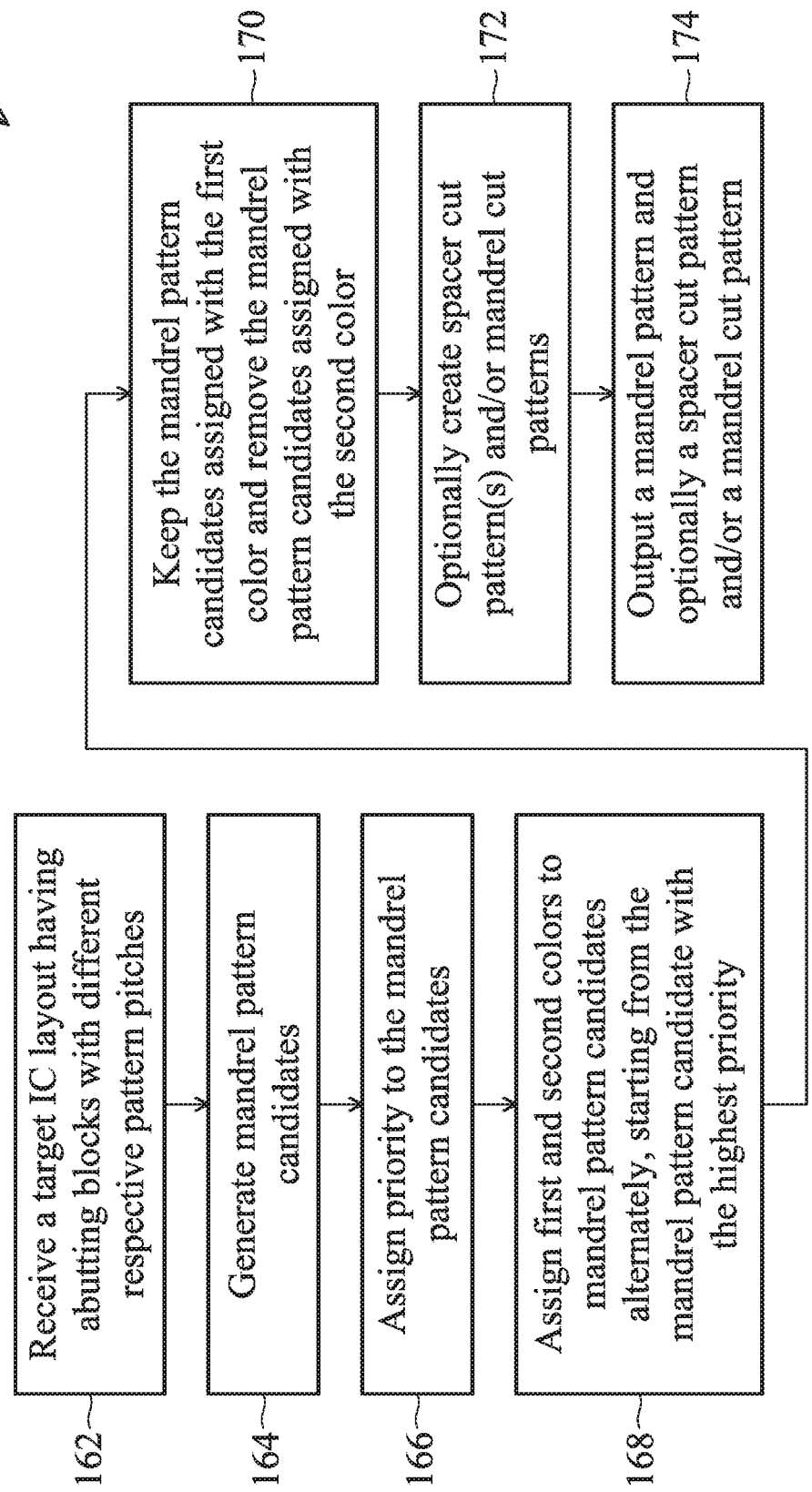
FIG. 1C is a flow chart of a method of designing mandrel patterns according to one or more embodiments of the present disclosure.

Referring now to FIG. 1C, a flow chart of a method 160 for forming mandrel patterns is illustrated. The method 160 may be implemented, in whole or in part, by the mandrel pattern preparation 114 (FIG. 1A). It is understood that additional operations can be provided before, during, and after the method 160, and some operations described can be replaced, eliminated, or moved around for additional embodiments of the method. The method 160 is an example, and is not intended to limit the present disclosure beyond what is explicitly recited in the claims. The method 160 includes operations 162, 164, 166, 168, 170, 172, and 174. These operations are further discussed below.

At operation 162, the method 160 receives a target IC design layout 104. The IC design layout 104 has target patterns, such as elongated pieces representing fin active regions, gate electrodes, or other IC features. These target patterns belong to different design blocks that abut each other. Patterns in a block have a fixed (same) pattern pitch, and patterns in different blocks may have different pattern pitches. Furthermore, these patterns are to be formed using mandrel spacer techniques. More specifically, these patterns correspond to the spacer patterns in the mandrel spacer techniques.

At operation 164, the method 160 generates mandrel pattern candidates. These mandrel pattern candidates fill the space between adjacent target patterns. In an embodiment, if all blocks are logic blocks (i.e., there is no SRAM blocks or other types of special macros), the mandrel pattern candidates may start from one edge (e.g., the leftmost edge) of the IC design layout 104 which is the edge with the highest priority, and fill the space towards the opposite edge (e.g., the rightmost edge) of the IC design layout 104. This continues until each target pattern has a mandrel pattern candidate on its right side. The benefits of such configuration will become evident as discussed later. Further in the present embodiment, the mandrel pattern candidate has the same length as the target pattern immediately to its left. In some embodiments, a mandrel pattern candidate may be longer than the target pattern on its left side. To further these embodiments, one or more cut patterns may be generated for cutting the eventual mandrel patterns in a lithography process. This is the case, for example, when one of the target pattern is shorter than adjacent target patterns to its left and right sides.

In another embodiment, if the IC design layout 104 includes SRAM blocks (or other types of special macros) abutting logic blocks, the mandrel pattern candidates may start from the boundaries of the SRAM blocks, and fill the space towards opposite edges (the leftmost and rightmost edges) of the IC design layout 104. This continues until each target pattern has a mandrel pattern candidate on its right side and another mandrel pattern on its left side. The benefits of such configuration will become evident as discussed later. In various embodiments, since the mandrel pattern candidates fill the space in different blocks, they may have varying widths and varying pitches. Only a subset of the mandrel pattern candidates will be presented to mask fabrication 118 (FIG. 1A).

At operation 166, the method 160 assigns priorities to the mandrel pattern candidates. In an embodiment where all blocks in the IC design layout 104 are logic blocks, a mandrel pattern candidate located at an edge of the IC design layout 104 (e.g., the leftmost mandrel pattern candidate) is assigned with the highest priority. In another embodiment where the IC design layout 104 includes one or more SRAM blocks (or other types of special macros) abutting logic blocks, a mandrel pattern candidate located on the boundary of the SRAM blocks and logic blocks is assigned the highest priority.

At operation 168, the method 160 colors (or assigns colors to) the mandrel pattern candidates. In an embodiment, the method 160 assigns two colors, first color (or color A) and second color (or color B), to the mandrel pattern candidates. The mandrel pattern candidate with the highest priority is colored with the color A. Further, any two adjacent mandrel pattern candidates are colored with different colors. In other words, the mandrel pattern candidate immediately to the right of the A-colored mandrel pattern candidate is colored with the color B, and the mandrel pattern candidate immediately to the right of the B-colored mandrel pattern candidate is colored with the color A. This alternating coloring process continues until all mandrel pattern candidates to the right of the highest-priority mandrel pattern candidate are colored. The same coloring process is applied to the mandrel pattern candidates located to the left of the highest-priority mandrel pattern candidate.

At operation 170, the method 160 keeps the mandrel pattern candidates with the first color (color A) and removes the mandrel pattern candidates with the second color (color B). The A-colored mandrel pattern candidates become the mandrel patterns for subsequent processing, including mask fabrication.

At operation 172, the method 160 optionally creates patterns for cutting (or removing) spacer patterns. These patterns are referred to as spacer cut patterns. This is the case when a mandrel pattern only has a target pattern on one side thereof. Since spacer patterns will be formed on both sides of this mandrel pattern, one of the spacer patterns does not correspond to a target pattern and needs to be removed. The spacer cut patterns can be used for removing such extra spacer patterns in a photolithography process. At operation 172, the method 160 optionally creates patterns for partially cutting (or removing) mandrel patterns. These patterns are referred to as mandrel cut patterns. This is the case when a mandrel pattern has a length greater than the associated target pattern(s). The extra portion of the mandrel pattern is cut by a mandrel cut pattern in a photolithography process.

At operation 174, the method 160 outputs the mandrel patterns (the A-colored mandrel pattern candidates) for mask fabrication, as discussed with respect to FIG. 1A. Further, the method 160 may also output a mandrel cut pattern and/or a spacer cut pattern for mask fabrication. The mandrel patterns and optionally the mandrel cut pattern and the spacer cut pattern are outputted in a computer-readable format, such as GDII file, as discussed above. The mandrel patterns, the mandrel cut pattern, and the spacer cut pattern may be used in separate photolithography processes in manufacturing IC features, which will be discussed later, in conjunction with FIGS. 6A-6E.

Figure 2A:
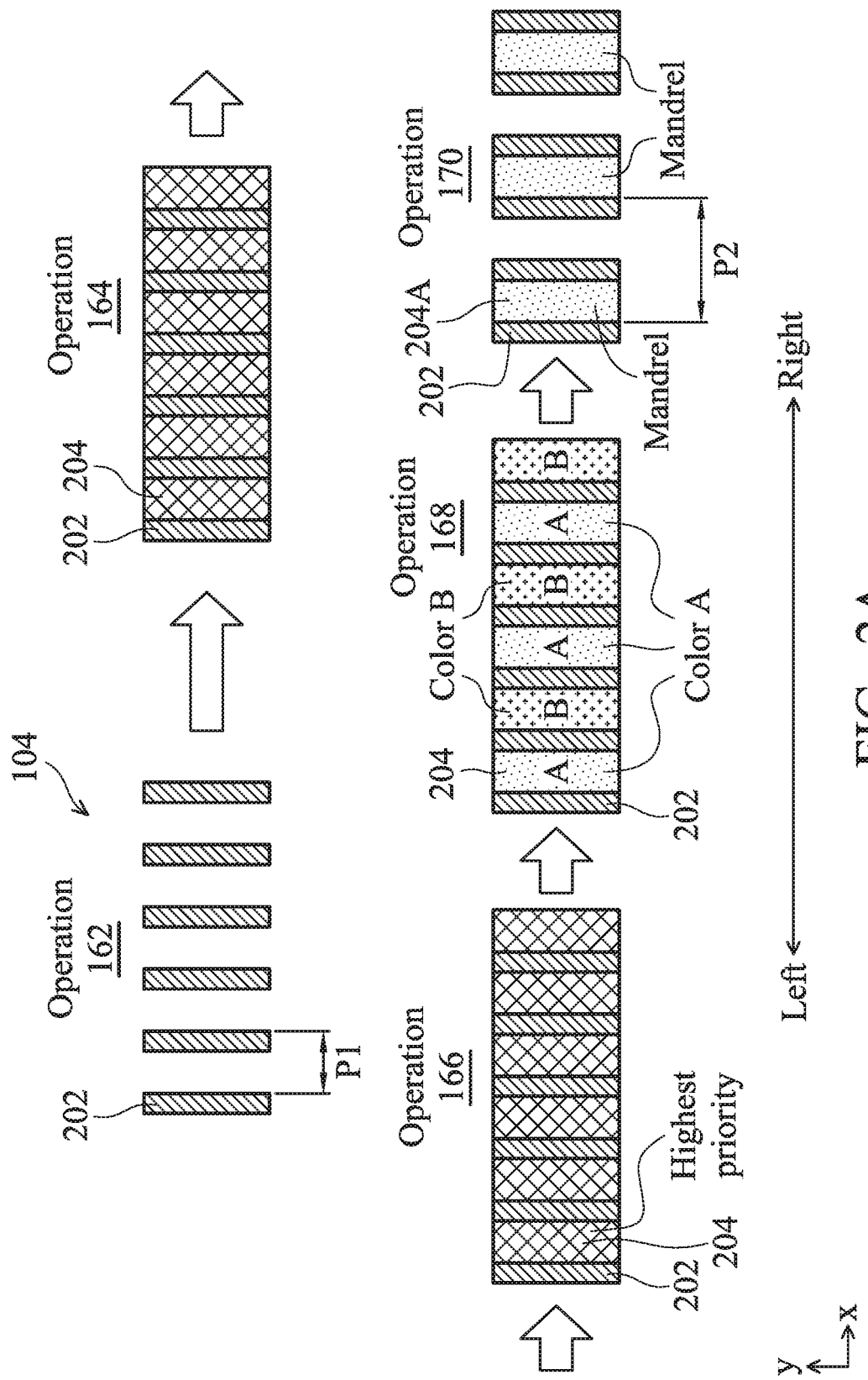
FIGS. 2A, 2B, 2C, and 2D illustrate examples of designing mandrel patterns for a target IC layout, using the method of FIG. 1C in accordance with some embodiments.

The method 160 will be further described below in conjunction with FIGS. 2A-5. Referring to FIG. 2A, at operation 162, the method 160 receives a target IC layout 104 having target patterns 202. The target patterns 202 have an elongated shape, and are oriented lengthwise along a first direction "y" and distributed along a second direction "x" perpendicular to the first direction. The target patterns 202 have a pattern pitch P1 in the second direction. In this embodiment, the pitch P1 is fixed in the target IC layout 104, i.e., it remains the same from one target pattern 202 to the next target pattern 202. The target patterns 202 may correspond to fin active regions, gate electrodes, or other IC features. In this embodiment, there are even-number (6 in this example) of target patterns.

At operation 164, the method 160 fills the space between the target patterns 202 with mandrel pattern candidates 204. In this embodiment, the target IC layout 104 has only logic blocks and the mandrel pattern candidates 204 fill the spaces from the left to the right (the leftmost space is given the highest priority). In an embodiment, the operation 164 fills the spaces with mandrel pattern candidates until each target pattern 202 has a mandrel pattern candidate to its right. This ensures each target pattern is covered by at least one mandrel pattern after some of the mandrel pattern candidates are removed in operation 170, regardless of whether there are even-number or odd-number of target patterns. As shown in FIG. 2A, operation 164, the first mandrel pattern candidate 204 fills a space between two leftmost target patterns 202, and the other mandrel pattern candidates 204 fill spaces between target patterns 202 from left to right. In another embodiment, the first mandrel pattern candidate 204 fills a space between two rightmost target patterns 202, and the other mandrel pattern candidates 204 fill spaces between target patterns 202 from right to left.

At operation 166, the method 160 assigns priorities to the mandrel pattern candidates 204. In this embodiment, the leftmost mandrel pattern candidate 204 is assigned with the highest priority. At operation 168, the method 160 colors the mandrel pattern candidates 204, starting from the leftmost mandrel pattern candidate which has the highest priority. As illustrated, the leftmost mandrel pattern candidate 204 is colored with color A, and the other mandrel pattern candidates are colored with color B, color A, color B, color A, and so on, in an alternating fashion from left to right. In this example, the rightmost mandrel pattern candidate is colored with color B.

At operation 170, the method 160 removes the mandrel pattern candidates with color B, and keeps the mandrel pattern candidates with color A (labeled as 204-A) as mandrel patterns for subsequent processes. For example, the mandrel patterns 204-A are fabricated onto a mask for exposing a wafer. It is noted that the target patterns 202 are not fabricated onto a mask in the present embodiment. Rather, they are formed as spacer features using a mandrel spacer technique. The mandrel patterns 204-A have a pitch P2 which is twice of P1. The larger pitch in the mandrel patterns 204-A makes them easier to fabricate using lithography processes (e.g., having larger process window, etc.) than the target patterns 202 would. In this embodiment, the method 160 does not perform the operation 172 as every spacer feature corresponds to a target pattern 202. At operation 174, the method 160 outputs the mandrel patterns 204-A for mask fabrication.

Figure 2B:
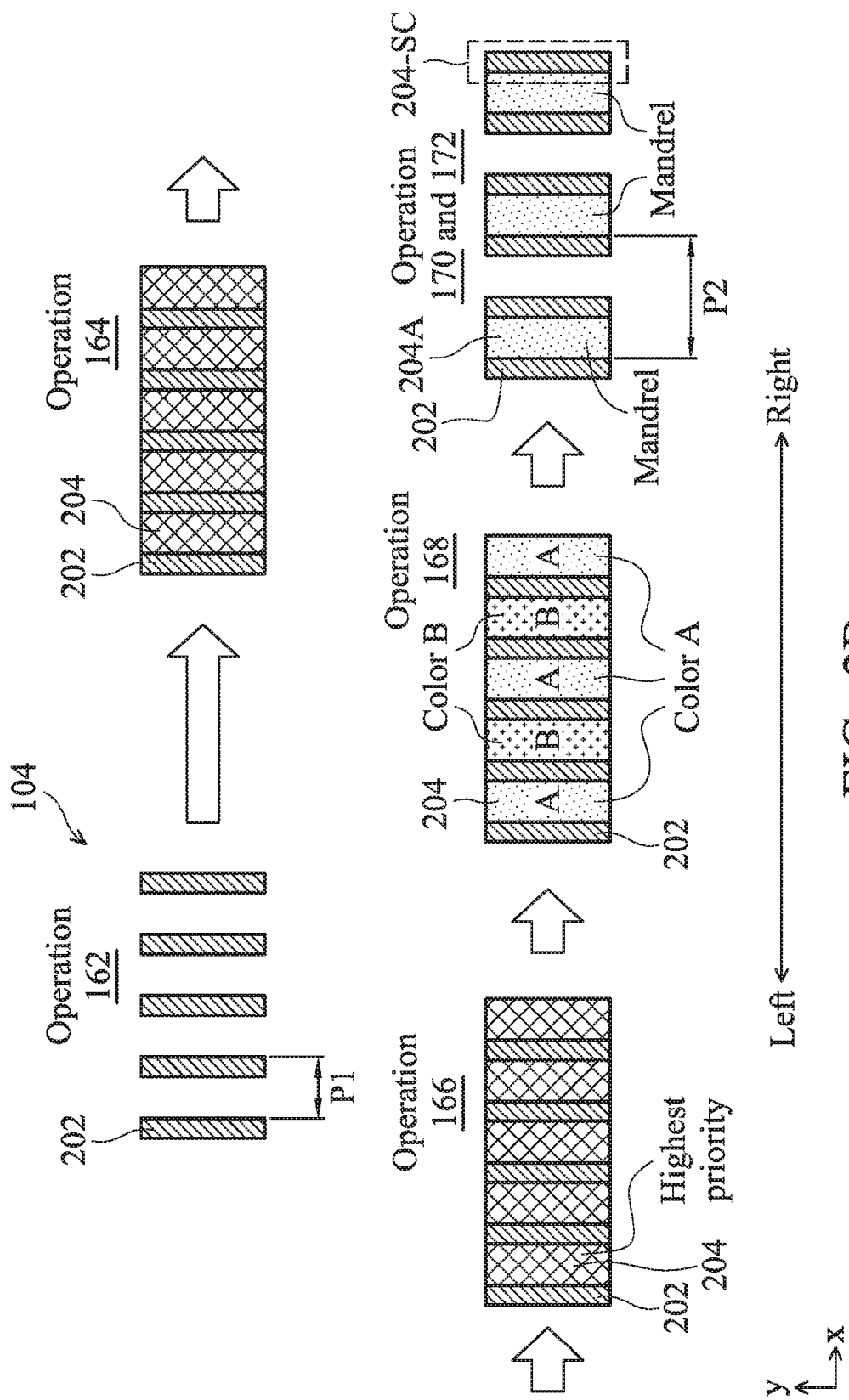

Referring to FIG. 2B, shown therein is an illustration of the method 160 performed on another embodiment of the IC design layout 104. This embodiment of IC design layout 104 is similar to that in FIG. 2A except that it has odd-number (5 in this example) of target patterns. The operations 164, 166, 168, and 170 are the same as discussed with respect to FIG. 2A. At the end of the operation 170, three mandrel patterns 204-A are created and each of them will be used for forming spacer features on both sides thereof. However, the rightmost spacer feature does not correspond to a target pattern 202. At operation 172, the method 160 creates a spacer cut pattern 204-SC, which is used in a photolithography process for removing the rightmost spacer feature. The spacer cut pattern 204-SC overlaps (or covers) one side of the mandrel pattern 204-A. At operation 174, the method 160 outputs the mandrel patterns 204-A and the spacer cut pattern 204-SC for mask fabrication.

Figure 2C:
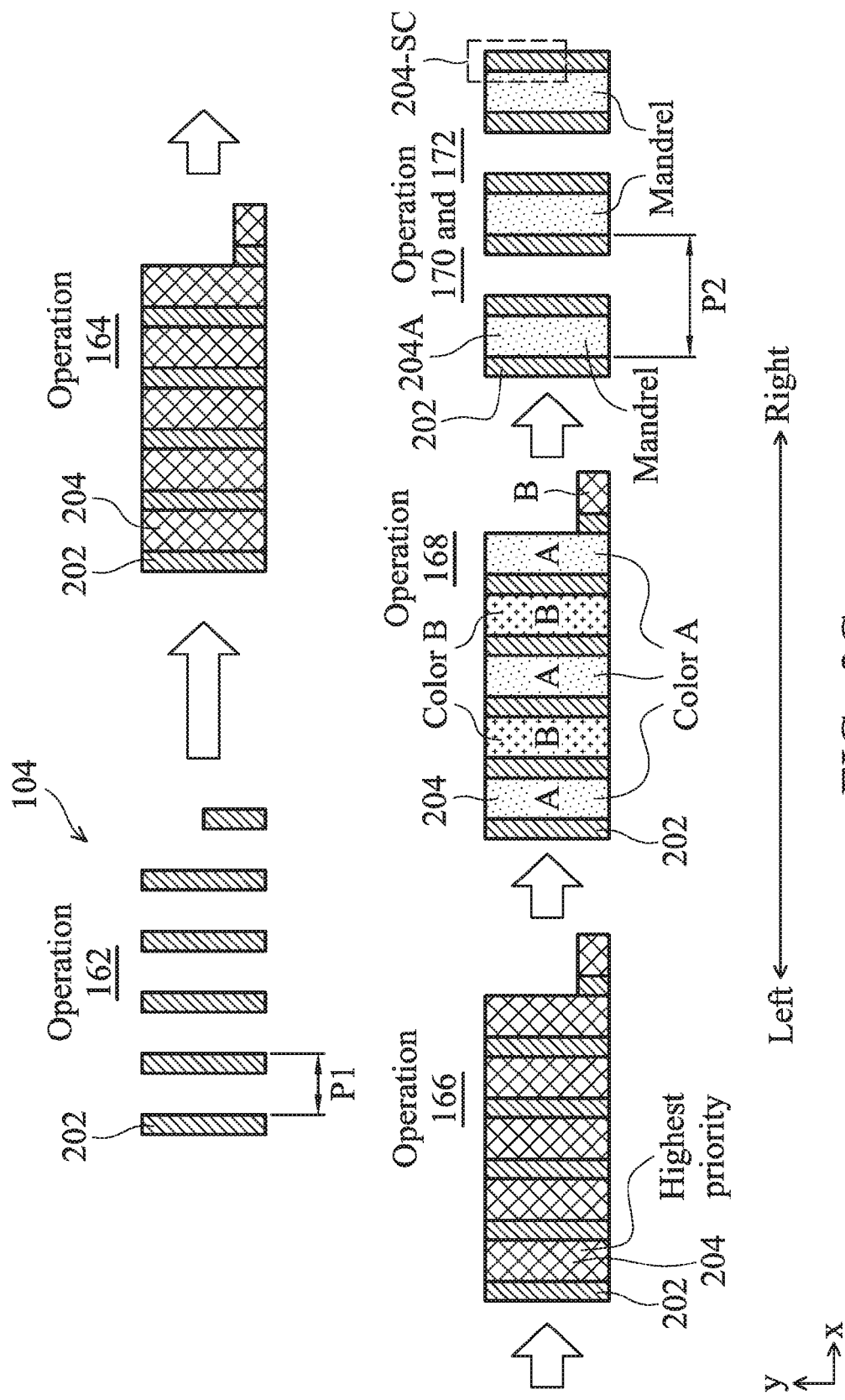

Referring to FIG. 2C, shown therein is an illustration of the method 160 performed on yet another embodiment of the IC design layout 104. This embodiment of IC design layout 104 is similar to that in FIG. 2A except that all the target patterns do not have the same length. In this example, the rightmost target pattern is shorter than other target patterns. At the operation 164, the method 160 fills the space between the target patterns 202 with mandrel pattern candidates 204. In this example, the rightmost mandrel pattern candidate 204 has the same length as the target pattern 202 on its left. Therefore, it is shorter in length than other mandrel pattern candidates 204. The operations 166, 168, and 170 are the same as discussed with respect to FIG. 2A. At the end of the operation 170, three mandrel patterns 204-A are created and each of them will be used for forming spacer features on both sides thereof. However, the rightmost spacer feature only partially corresponds to a target pattern 202. At operation 172, the method 160 creates a spacer cut pattern 204-SC, which is used in a photolithography process for removing the extra portions of the rightmost spacer feature. At operation 174, the method 160 outputs the mandrel patterns 204-A and the spacer cut pattern 204-SC for mask fabrication.

Figure 2D:
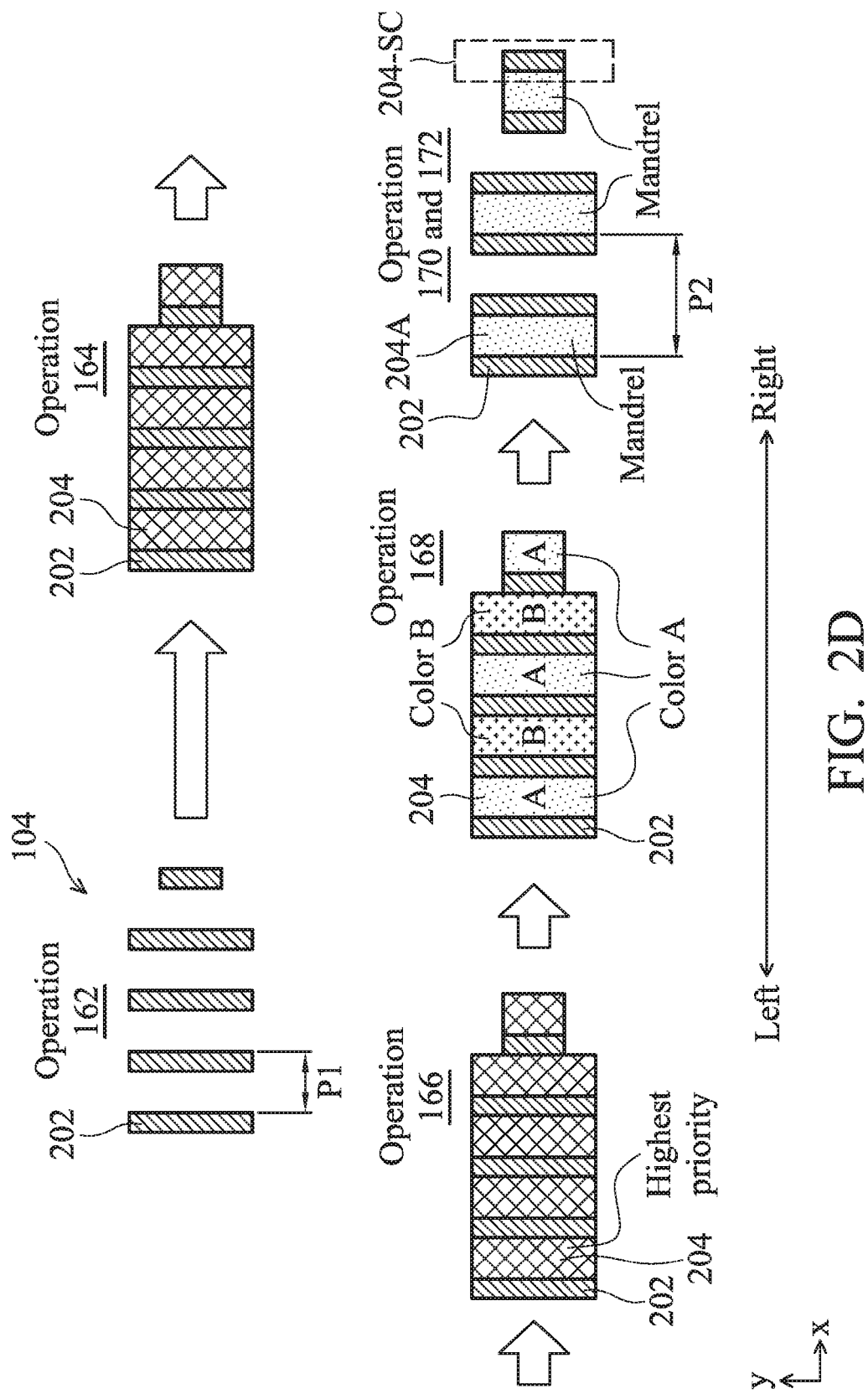

In embodiments, the shorter target pattern 202 as shown in FIG. 2C may be aligned with the top of the other target patterns 202, aligned with the bottom of the other target patterns 202, or aligned with a middle portion (not aligned with either top or bottom) of the other target patterns 202, such as shown in FIG. 2D. Further, the shorter target pattern 202 may be an even-numbered target pattern or an odd-numbered target pattern, counting from the highest-priority target pattern. The embodiment in FIG. 2C illustrates an example where the shorter target pattern 202 is an even-numbered target pattern (the 6$^{th}$ target pattern from the left). FIG. 2D illustrates another example where the shorter target pattern 202 is an odd-numbered target pattern (the 5$^{th}$ target pattern from the left). The operations 164-174 for FIG. 2D are performed in the same way as discussed with respect to FIG. 2B.

As illustrated in FIGS. 2A-2D, the method 160 is capable of processing IC design layout 104 having variations in the number of target patterns and in the length of the target patterns. Further examples below will show the capability of the method 160 in processing IC design layouts having variations in target pattern pitches and/or having mixed logic and macro blocks.

Figure 3A:
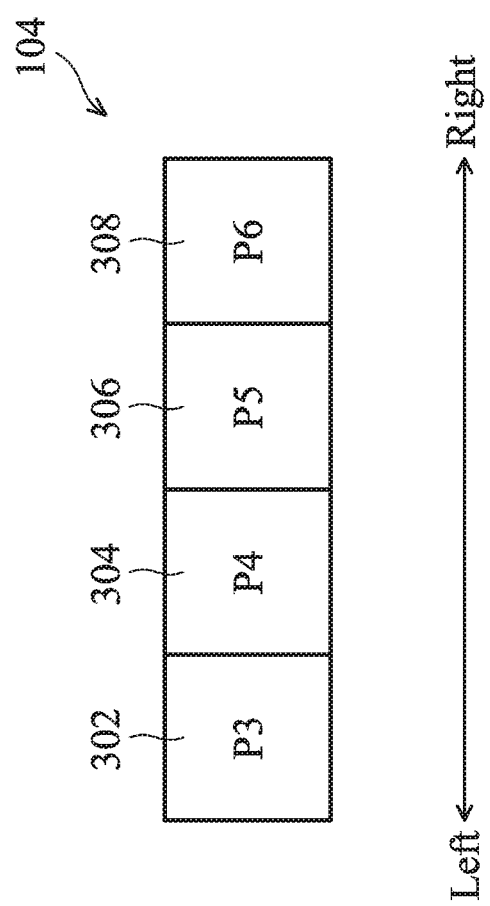
FIG. 3A illustrates an exemplary IC layout having multiple abutting blocks with varying pattern pitches.

Referring to FIG. 3A, shown therein is another embodiment of the target IC layout 104. In this embodiment, the target IC layout 104 includes multiple abutting blocks. In this particular example, the target IC layout 104 includes design blocks 302, 304, 306, and 308 that abut each other (i.e. adjacent blocks share a block boundary) from left to right. Furthermore, the various design blocks may have different pattern pitches from block to block. In an example, the design block 302 has a target pattern pitch P3 which is 57 nanometers (nm); the design block 304 has a target pattern pitch P4 which is 60 nm; the design block 306 has a target pattern pitch P5 which is 54 nm; while the design block 308 has a target pattern pitch P6 which is 90 nm. Of course, these are merely examples. In various embodiments, the target IC layout 104 may include any number of two or more abutting blocks and the blocks may have same or different target pattern pitches. Within each of the blocks 302-308, the target patterns may be arranged similar to one of the embodiments shown in FIGS. 2A-2D, or may be arranged in a configuration different from the embodiments shown in FIGS. 2A-2D.

Figure 3B:
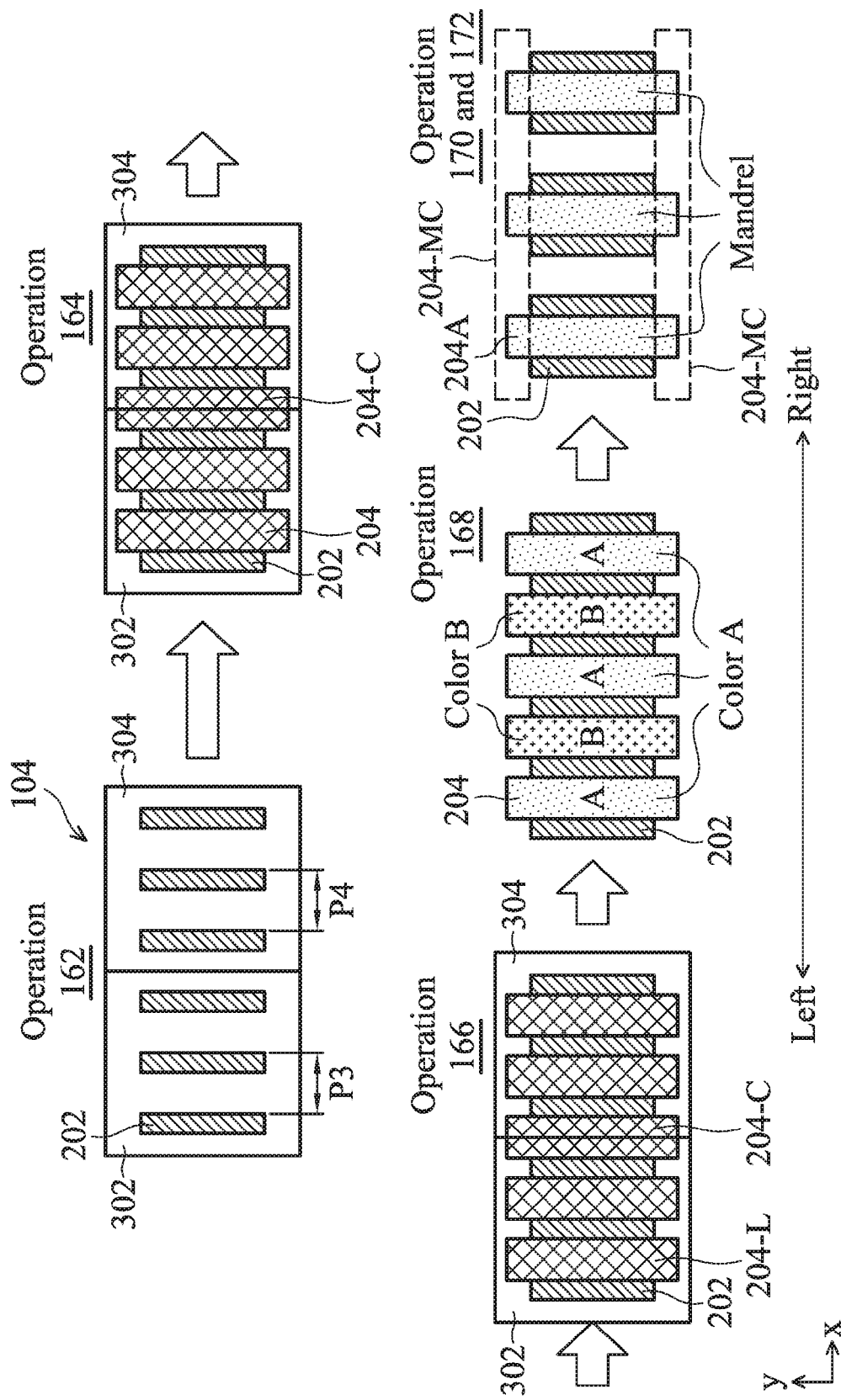
FIG. 3B illustrates an example of designing mandrel patterns for the target IC layout in FIG. 3A, using the method of FIG. 1C in accordance with an embodiment.

Referring to FIG. 3B, shown therein is an illustration of the operations 162-170 when the method 160 is applied to the target IC layout 104 as shown in FIG. 3A. For the purposes of simplification, only blocks 302 and 304 are shown. At operation 162, the method 160 receives the target IC layout 104. The blocks 302 and 304 abut. The block 302 has target patterns 202 with a pitch P3, and the block 304 has target patterns 202 with a pitch P4. At operation 164, the method 160 fills the space between the target patterns 202 with mandrel pattern candidates 204. In this embodiment, the blocks 302 and 304 are logic blocks, and the mandrel pattern candidates 204 are filled from the left to the right of the IC design layout 104. One of the mandrel pattern candidates 204-C is at the cross-boundary of the blocks 302 and 304. In this embodiment, the mandrel pattern candidates have a length greater than the target patterns. The extra portion of the eventual mandrel patterns will be removed by a mandrel cut pattern, as shown later.

Still referring to FIG. 3B, at operation 166, the method 160 assigns priorities to the mandrel pattern candidates 204. In an embodiment, the method 160 assigns the highest priority to the leftmost mandrel pattern candidate 204-L. In another embodiment, the method 160 assigns the highest priority to the mandrel pattern candidate 204-C. This is a case, for example, when the blocks 302 and 304 dictate that the space between the target patterns to the left and right of the boundary be more precisely fabricated and maintained. At operation 168, the method 160 colors the mandrel pattern candidates 204, starting from the mandrel pattern candidate with the highest priority, which is 204-L in an embodiment and 204-C in another embodiment. The coloring process follows an alternating two-color scheme as discussed above. At operation 170, the method 160 removes the mandrel pattern candidates with color B, as discussed above. At operation 172, the method 160 creates mandrel cut patterns 204-MC for partially cutting (or removing) the mandrel patterns 204-A such that the spacer features on the sidewalls of the mandrel patterns will match the target patterns 202. At operation 174, the method 160 outputs the mandrel patterns 204-A and the mandrel cut pattern 204-MC for mask fabrication.

Figure 4:
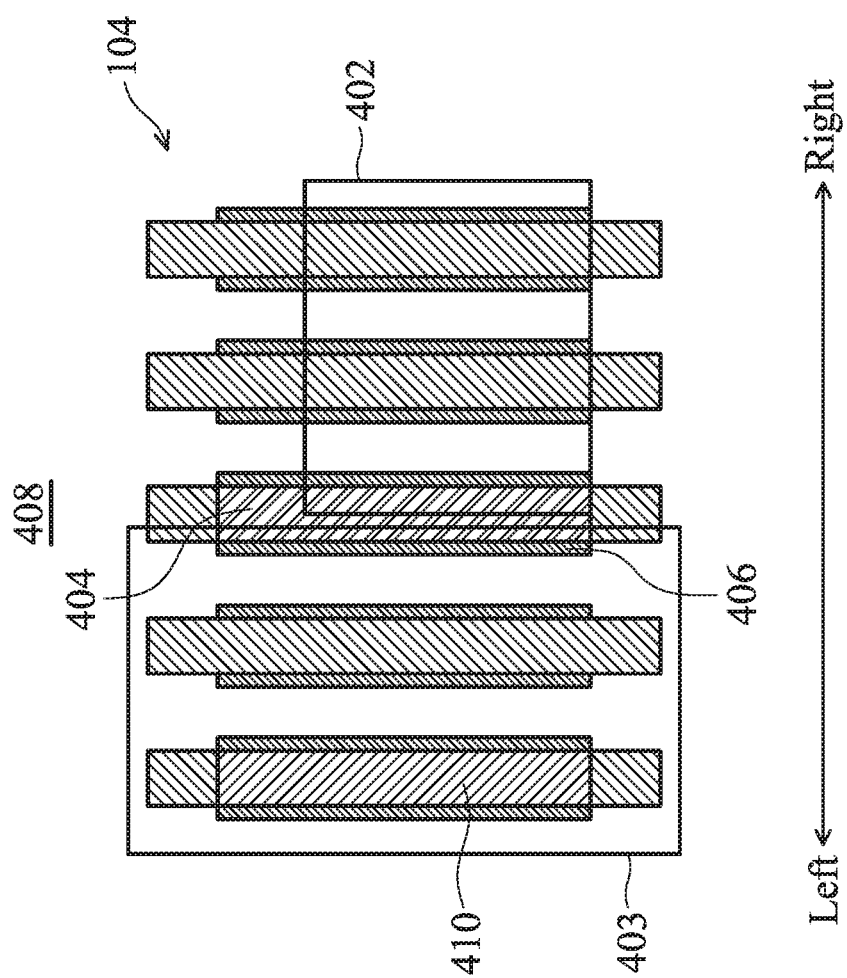
FIG. 4 illustrates an example of designing mandrel patterns for a target IC layout, using the method of FIG. 1C in accordance with an embodiment.

Referring to FIG. 4, shown therein is an illustration of designing mandrel patterns for an exemplary IC layout 104 in accordance with an embodiment. The IC layout 104 includes an SRAM block 402 abutted by a logic block 403 to its left. In an example, the logic block 403 may include circuits for reading and writing SRAM cells in the SRAM block 402. Even though not shown, there may be logic blocks abutting the SRAM block 402 to its right as well. In the present embodiment, the pattern pitches in the logic block(s) 403 and the SRAM block 402 may be the same or different. In a particular embodiment, the pattern pitches in the logic block(s) 403 are greater than the pattern pitch in the SRAM block 402. When abutting SRAM blocks with logic blocks, certain design rules are to be followed. For example, one of the design rules dictates that the boundary between the logic block 403 and the SRAM block 402 is safeguarded with margins. In other words, a target pattern 406 or 408 should not appear right at the boundary of the two blocks. Rather, target patterns 406 and 408 should be fabricated to the left and right of the boundary with certain clearance. As illustrated in FIG. 4, the target patterns 406 and 408, which are the rightmost target pattern in the logic block 403 and the leftmost target pattern in the SRAM block 402, are located to the left and right of the block boundary. A mandrel pattern candidate 404 fills the space between the target patterns 406 and 408. In this embodiment, the method 160 assigns the highest priority to the mandrel pattern candidate 404, and may assign the second highest priority to the leftmost mandrel pattern candidate 410. FIG. 4 further illustrates the results at the end of the operation 170 where the mandrel pattern candidates 404 and other mandrel patterns are kept for mask fabrication.

Figure 5:
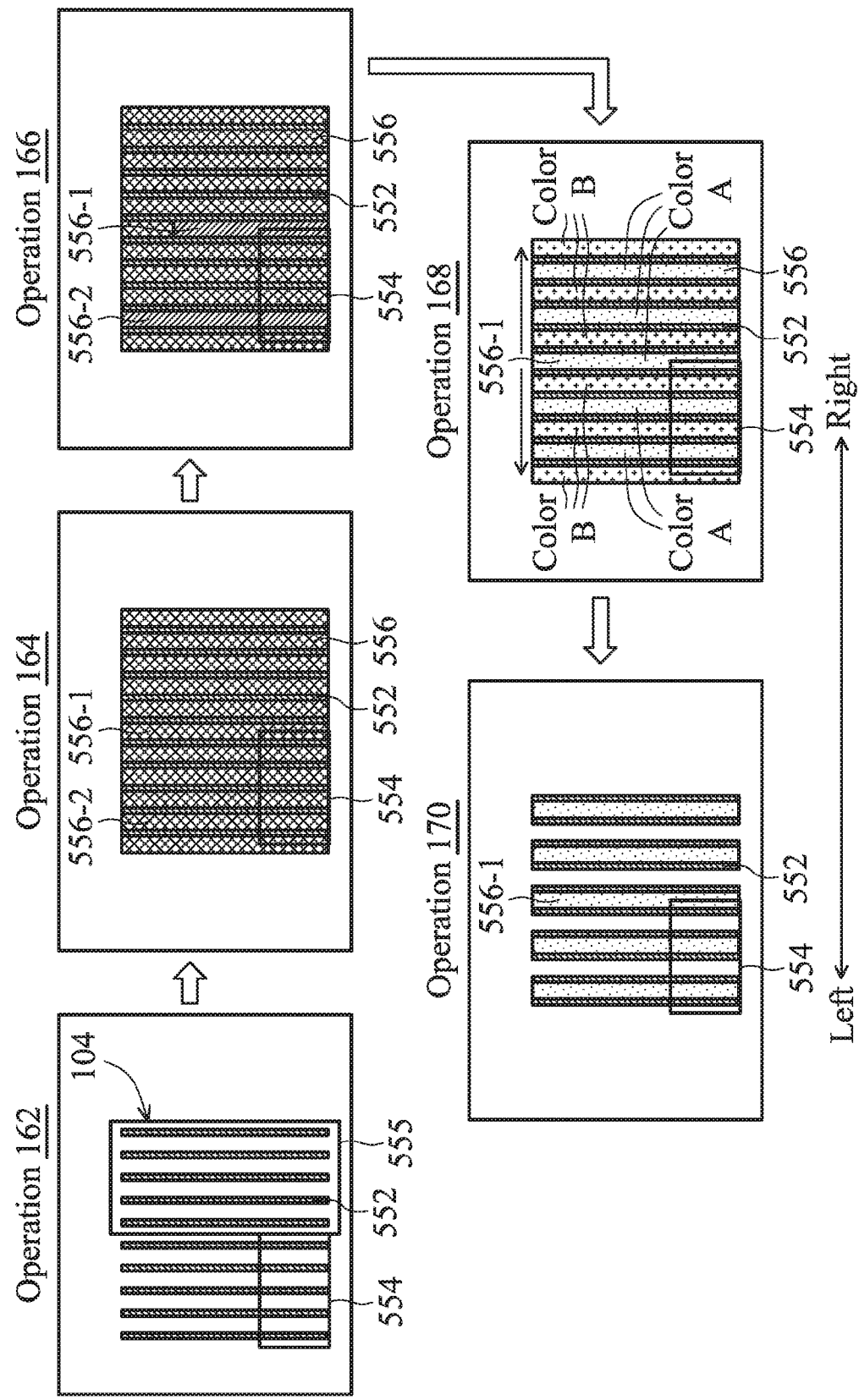
FIG. 5 illustrates steps of designing mandrel patterns for an exemplary IC layout, using the method of FIG. 1C in accordance with an embodiment.

Referring to FIG. 5, shown therein is an illustration of the operations 162-170 when the method 160 is applied to a target IC layout 104 which has an SRAM block abutting at least one logic block. At operation 162, the method 160 receives the target IC layout 104 which includes an SRAM block 554 abutting a logic block 555. The target patterns 552 are elongated pieces distributed across the SRAM block 554 and the logic block 555. In an embodiment, the target patterns 552 have different pitches in the SRAM block 554 and in the logic block 555. Even though not shown, the SRAM block 554 may abut another logic block to its left, such as the logic block 403 in FIG. 4. Further, the target patterns 552 may have different pitches in the SRAM block 554, in the logic block 555, and in the another logic block. Two target patterns sandwich the boundary of the blocks 554 and 555 with certain clearance.

At operation 164, the method 160 fills the space between the target patterns 552 with mandrel pattern candidates 556. One of the mandrel pattern candidates 556-1 is at the boundary of the blocks 554 and 555. In an embodiment, the method 160 generates the mandrel pattern candidates 556 such that each target pattern 552 has a mandrel pattern candidate immediately to its left and another mandrel pattern candidate immediately to its right. In other words, each target pattern 552 is sandwiched between two mandrel pattern candidates 556. This ensures that all target patterns will be covered by at least one mandrel pattern candidate no matter which mandrel pattern candidate is assigned with the highest priority. At operation 166, the method 160 assigns priorities to the mandrel pattern candidates 556. In the present embodiment, the method 160 assigns the highest priority to the mandrel pattern candidate 556-1. At operation 168, the method 160 colors the mandrel pattern candidates 556, starting from the mandrel pattern candidate 556-1. In other words, the mandrel pattern candidate 556-1 is colored with color A, and the other mandrel pattern candidates are colored using either color A or color B in an alternating fashion as discussed above and as labeled in FIG. 5, operation 168. At operation 170, the method 160 removes the mandrel pattern candidates with color B, as discussed above. In this embodiment, the method 160 does not perform the operation 172. At operation 174, the method 160 outputs the mandrel patterns 556 with color A for mask fabrication.

Figure 6A:
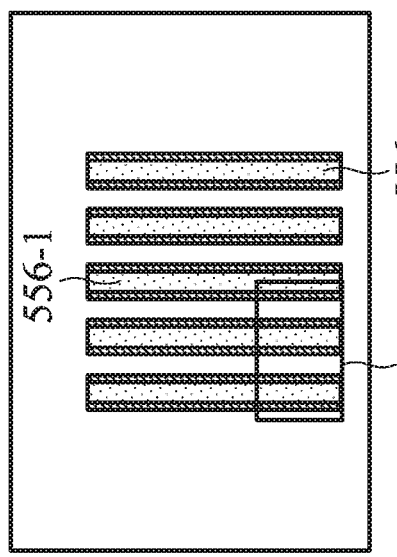

FIG. 6A is a top view of mandrel patterns 556 produced by the mask house 110. FIGS. 6B-6E illustrate cross-sectional views of a device (e.g., a wafer) undergoing one or more patterning processes including mandrel spacer patterning 124 (FIG. 1A) using the mandrel patterns 556.

Figure 6B:
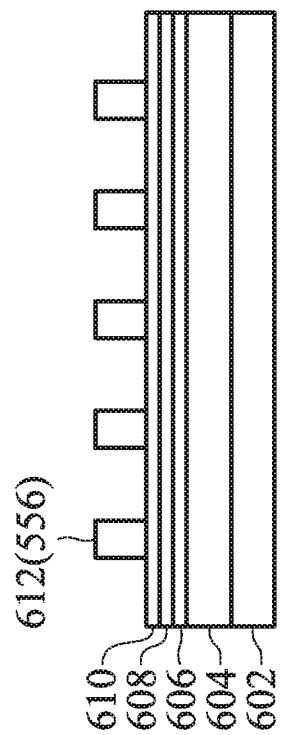

Referring to FIG. 6B, mandrel patterns 556 in the form of resist patterns (or resist features or mandrel features) 612 are formed over a plurality of layers disposed over a substrate 602. The substrate 602 may be a semiconductor substrate such as a silicon wafer. The substrate 602 may also include other semiconductors such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. Further, the substrate 602 may optionally include epitaxial layers, be strained for performance enhancement, include a silicon-on-insulator structure, and/or have other suitable enhancement features. The substrate 602 may include fin structures, doped regions, isolation features, and/or other IC features.

The plurality of layers includes a patterning layer 604, a hard mask layer 606, a bottom layer 608, and a middle layer 610. In an embodiment, the patterning layer 604 includes poly silicon and/or a dielectric material such as an extreme low-k dielectric (ELK) material; the hard mask layer 606 includes titanium nitride; the bottom layer 608 includes a bottom anti-reflection coating polymeric material; and the middle layer 610 includes silicon containing polymer. The resist features 612 are formed using a photolithography process, which includes photoresist coating, soft baking, exposing, post-exposure baking, developing, and hard baking in one example. The exposure process uses a mask having the mandrel patterns 556 as shown in FIG. 6A. The after-development resist features 612 generally match the mandrel patterns 556 in terms of top-view dimensions and spacing.

Referring to FIG. 6C, spacer features 614 are formed on sidewalls of the mandrel features 612. In an embodiment, the mandrel features may be transferred from the resist features 612 to another layer (such as the hard mask layer 606 or the patterning layer 604), and the spacer features 614 are formed on sidewalls of the new mandrel features. Therefore, in FIG. 6C, the mandrel features 612 may be interpreted as features in the resist layer or in another layer. The spacer features 614 include one or more material different from the mandrel features 612. In an embodiment, the spacer features 614 may include a dielectric material, such as titanium nitride, silicon nitride, or titanium oxide. The spacer features 614 are formed to have a certain thickness (dimension along the "x" direction), such as 8 nm or 11 nm, depending on the width of the target patterns, such as the target patterns 202 in FIGS. 2 and 3B and the target patterns 552 in FIG. 5. The spacer features 614 can be formed by various processes, including a deposition process and an etching process. For example, the deposition process includes a chemical vapor deposition (CVD) process or a physical vapor deposition (PVD) process. For example, the etching process includes an anisotropic etch such as plasma etch. In an embodiment, before the spacer features 614 are formed, the mandrel features 612 are partially removed using mandrel cut patterns, such as 204-MC (FIG. 3B). This may be performed in a separate photolithography process.

Referring to FIG. 6D, the mandrel features 612 are removed, leaving the spacer features 614 as an etch mask for subsequent processes. The mandrel features 612 may be removed by a plasma ashing processing, a dry etching process, a wet etching process, or another suitable process. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may use a wet etching solution having $NH_4OH$, HF (hydrofluoric acid) or diluted HF, deionized water, TMAH (tetramethylammonium hydroxide), other suitable wet etching solutions, or combinations thereof. In an embodiment, the spacer features 614 are partially removed using spacer cut patterns, such as 204-SC (FIGS. 2B-2D). This may be performed in a separate photolithography process.

Referring to FIG. 6E, the pattern represented by the spacer features 614 is transferred to the patterning layer 604 through one or more etching processes, which may include a dry etching process, a wet etching process, or other suitable etching processes. In an embodiment, the patterned layer 604 includes poly silicon and is used as gate electrodes for FinFET devices. To further this embodiment, the patterned layer 604 includes poly silicon features used as place holders for metal gate stacks in a gate-replacement process.

Although not intended to be limiting, one or more embodiments of the present disclosure provide many benefits to IC design and manufacturing. For example, embodiments of the preset disclosure provide an efficient and effective method for designing mandrel patterns for an IC layout which may include abutting blocks having different pattern pitches, SRAM blocks abutting logic blocks, or a combination thereof. The disclosed method is capable of generating mandrel patterns (and cut patterns) across block boundaries, for target patterns having different lengths, and for any number of target patterns.

In one exemplary aspect, the present disclosure is directed to a method for integrated circuit (IC) manufacturing. The method includes receiving a target IC design layout having two abutting blocks, each of the two abutting blocks having target patterns spaced according to a pattern pitch, the two abutting blocks have different pattern pitches. The method further includes filling mandrel pattern candidates in spaces between the target patterns; assigning a first one of the mandrel pattern candidates with a high priority; and coloring the mandrel pattern candidates with first and second colors. The coloring of the mandrel pattern candidates includes coloring the first one of the mandrel pattern candidates with the first color; and coloring any two adjacent mandrel pattern candidates with different colors. The method further includes removing the mandrel pattern candidates that are colored with the second color; and outputting a mandrel pattern in computer-readable format for mask fabrication, the mandrel pattern including the mandrel pattern candidates that are colored with the first color.

In another exemplary aspect, the present disclosure is directed to a method for integrated circuit (IC) manufacturing. The method includes receiving an IC design layout having abutting blocks, each of the abutting blocks having target patterns spaced according to a pattern pitch along a first direction, the target patterns having an elongated shape extending along a second direction perpendicular to the first direction. The method further includes creating mandrel pattern candidates that fill spaces between the target patterns; coloring a first one of the mandrel pattern candidates with a first color; and coloring other ones of the mandrel pattern candidates with the first color and a second color such that any two adjacent mandrel pattern candidates are colored with different colors. The method further includes removing the mandrel pattern candidates that are colored with the second color; and outputting a mandrel pattern in computer-readable format for mask fabrication. The mandrel pattern has the mandrel pattern candidates that are colored with the first color.

In yet another exemplary aspect, the present disclosure is directed to a method for integrated circuit (IC) manufacturing. The method includes receiving an IC design layout having multiple blocks, each of the blocks having target patterns extending lengthwise along a first direction and spaced according to a pattern pitch along a second direction perpendicular to the first direction, at least two of the blocks having different pattern pitches, one of the blocks being an SRAM block. The method further includes creating mandrel pattern candidates that fill spaces between the target patterns, wherein a first one of the mandrel pattern candidates fills a space where a boundary between the SRAM block and an adjacent block is located. The method further includes coloring the first one of the mandrel pattern candidates with a first color; coloring other ones of the mandrel pattern candidates with the first color and a second color such that any two adjacent mandrel pattern candidates have different colors; and removing the mandrel pattern candidates that are colored with the second color. The method further includes outputting a mandrel pattern in computer-readable format for mask fabrication, the mandrel pattern having the mandrel pattern candidates that are colored with the first color.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for integrated circuit (IC) manufacturing, comprising:
   receiving a target IC design layout having two abutting blocks, each of the two abutting blocks having target patterns spaced according to a pattern pitch, the two abutting blocks have different pattern pitches;
   filling mandrel pattern candidates in spaces between the target patterns;
   coloring the mandrel pattern candidates with first and second colors, which includes:
   coloring a first one of the mandrel pattern candidates with the first color; and
   coloring any two adjacent mandrel pattern candidates with different colors;
   removing the mandrel pattern candidates that are colored with the second color; and
   outputting a mandrel pattern in computer-readable format for mask fabrication, the mandrel pattern including the mandrel pattern candidates that are colored with the first color.

2. The method of claim 1, further comprising:
   creating a cut pattern for partially removing the mandrel pattern in a photolithography process.

3. The method of claim 2, further comprising:
   forming IC features on a semiconductor substrate using the mandrel pattern and the cut pattern.

4. The method of claim 1, further comprising:
   creating a cut pattern overlapping a side of the mandrel pattern.

5. The method of claim 4, further comprising:
   forming mandrel features on a semiconductor substrate, which includes performing a photolithography process using the mandrel pattern;
   forming spacer features on sidewalls of the mandrel features; and
   partially removing the spacer features, which includes performing another photolithography process using the cut pattern.

6. The method of claim 1, wherein the first one of the mandrel pattern candidates is proximate to an edge of the two abutting blocks.

7. The method of claim 6, wherein, after the filling of the mandrel pattern candidates, each of the target patterns has a mandrel pattern candidate immediately to its right.

8. The method of claim 1, wherein the first one of the mandrel pattern candidates is at a boundary between the two abutting blocks.

9. The method of claim 8, wherein, after the filling of the mandrel pattern candidates, each of the target patterns has a mandrel pattern candidate immediately to its left and another mandrel pattern candidate immediately to its right.

10. The method of claim 1, wherein one of the target patterns is shorter than another one of the target patterns.

11. The method of claim 1, wherein each of the mandrel pattern candidates has a length equal to that of the target pattern immediately to its left.

12. The method of claim 1, wherein a total number of the target patterns is an odd number.

13. A method for integrated circuit (IC) manufacturing, comprising:
    receiving an IC design layout having abutting blocks, each of the abutting blocks having target patterns spaced according to a pattern pitch along a first direction, the target patterns having an elongated shape extending along a second direction perpendicular to the first direction;
    creating mandrel pattern candidates that fill spaces between the target patterns;
    coloring a first one of the mandrel pattern candidates with a first color;
    coloring other ones of the mandrel pattern candidates with the first color and a second color such that any two adjacent mandrel pattern candidates are colored with different colors;
    removing the mandrel pattern candidates that are colored with the second color; and
    outputting a mandrel pattern in computer-readable format for mask fabrication, the mandrel pattern having the mandrel pattern candidates that are colored with the first color.

14. The method of claim 13, wherein the first one of the mandrel pattern candidates fills a space where a boundary between two of the abutting blocks is located.

15. The method of claim 14, wherein, after the creating of the mandrel pattern candidates, each of the target patterns has a mandrel pattern candidate immediately to its left and another mandrel pattern candidate immediately to its right.

16. The method of claim 13, wherein the first one of the mandrel pattern candidates fills a space between two leftmost target patterns of the abutting blocks.

17. The method of claim 13, wherein one of the target patterns is shorter than an adjacent one of the target patterns and is aligned with a middle portion of the adjacent one of the target patterns.

18. The method of claim 13, further comprising:
    creating a first cut pattern for partially removing the mandrel pattern in a photolithography process;
    creating a second cut pattern overlapping a side of the mandrel pattern; and
    outputting the first and second cut patterns in computer-readable format for mask fabrication.

19. A method for integrated circuit (IC) manufacturing, comprising:
    receiving an IC design layout having multiple blocks, each of the blocks having target patterns extending lengthwise along a first direction and spaced according to a pattern pitch along a second direction perpendicular to the first direction, at least two of the blocks having different pattern pitches, one of the blocks being an SRAM block;
    creating mandrel pattern candidates that fill spaces between the target patterns, wherein a first one of the mandrel pattern candidates fills a space where a boundary between the SRAM block and an adjacent block is located;
    coloring the first one of the mandrel pattern candidates with a first color;
    coloring other ones of the mandrel pattern candidates with the first color and a second color such that any two adjacent mandrel pattern candidates have different colors;
    removing the mandrel pattern candidates that are colored with the second color; and
    outputting a mandrel pattern in computer-readable format for mask fabrication, the mandrel pattern having the mandrel pattern candidates that are colored with the first color.

20. The method of claim 19, wherein after the creating of the mandrel pattern candidates, each target pattern is sandwiched between two adjacent mandrel pattern candidates.

* * * * *